(12) United States Patent
Moon

(10) Patent No.: US 10,482,930 B2
(45) Date of Patent: Nov. 19, 2019

(54) MEMORY CHIP WITH REDUCED POWER CONSUMPTION, BUFFER CHIP MODULE CONTROLLING THE SAME AND MEMORY MODULE INCLUDING THE SAME

(71) Applicant: SK hynix Inc., Icheon-si, Gyeonggi-do (KR)

(72) Inventor: Young-Suk Moon, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/926,638

(22) Filed: Mar. 20, 2018

(65) Prior Publication Data

US 2019/0088290 A1    Mar. 21, 2019

(30) Foreign Application Priority Data

Sep. 21, 2017    (KR) .................. 10-2017-0121949

(51) Int. Cl.
| | |
|---|---|
| G11C 5/14 | (2006.01) |
| G11C 8/06 | (2006.01) |
| G11C 11/4074 | (2006.01) |
| G11C 11/417 | (2006.01) |
| G11C 7/10 | (2006.01) |
| G11C 11/4093 | (2006.01) |
| G06F 13/16 | (2006.01) |
| G11C 7/20 | (2006.01) |
| G11C 8/12 | (2006.01) |
| G06F 13/42 | (2006.01) |
| G11C 11/4072 | (2006.01) |
| G11C 7/22 | (2006.01) |

(52) U.S. Cl.
CPC ............ *G11C 5/14* (2013.01); *G06F 13/1673* (2013.01); *G06F 13/4278* (2013.01); *G11C 7/109* (2013.01); *G11C 7/1072* (2013.01); *G11C 7/20* (2013.01); *G11C 8/06* (2013.01); *G11C 8/12* (2013.01); *G11C 11/4074* (2013.01); *G11C 11/4093* (2013.01); *G11C 11/417* (2013.01); *G11C 7/22* (2013.01); *G11C 11/4072* (2013.01); *G11C 2207/2227* (2013.01)

(58) Field of Classification Search
None
See application file for complete search history.

(56) References Cited

U.S. PATENT DOCUMENTS

| | | | |
|---|---|---|---|
| 5,930,177 A | 7/1999 | Kim | |
| 6,188,641 B1 * | 2/2001 | Uchida | ................ G11C 7/1072 365/189.05 |

(Continued)

OTHER PUBLICATIONS

"Next Big Thing: DDR4 3DS", Server Forum 2014, JEDEC.
Greenberg, "New Hardware to Increase Server Memory Capacity for In-Memory Computing and Big Data", Oct. 13, 2015, Synopsys.

*Primary Examiner* — J. H. Hur
(74) *Attorney, Agent, or Firm* — William Park & Associates LTD.

(57) ABSTRACT

In an embodiment a memory chip may be provided. The memory chip may include a chip select buffer configured to receive a chip select signal, a command buffer configured to receive a command signal, wherein the command signal is input after a time has elapsed since the chip select signal is activated and the command buffer is turned on when the command signal is input.

17 Claims, 17 Drawing Sheets

(56) References Cited

U.S. PATENT DOCUMENTS

| | | | | |
|---|---|---|---|---|
| 6,339,552 | B1* | 1/2002 | Taruishi | G11C 7/1066 365/189.05 |
| 9,471,517 | B1* | 10/2016 | Yoon | G06F 13/161 |
| 2007/0260841 | A1* | 11/2007 | Hampel | G06F 13/1684 711/167 |
| 2013/0077427 | A1* | 3/2013 | Kondo | G11C 8/18 365/230.06 |
| 2013/0311717 | A1* | 11/2013 | Kim | G06F 12/0246 711/104 |
| 2014/0160874 | A1 | 6/2014 | Wang | |

\* cited by examiner

<Prior Art>

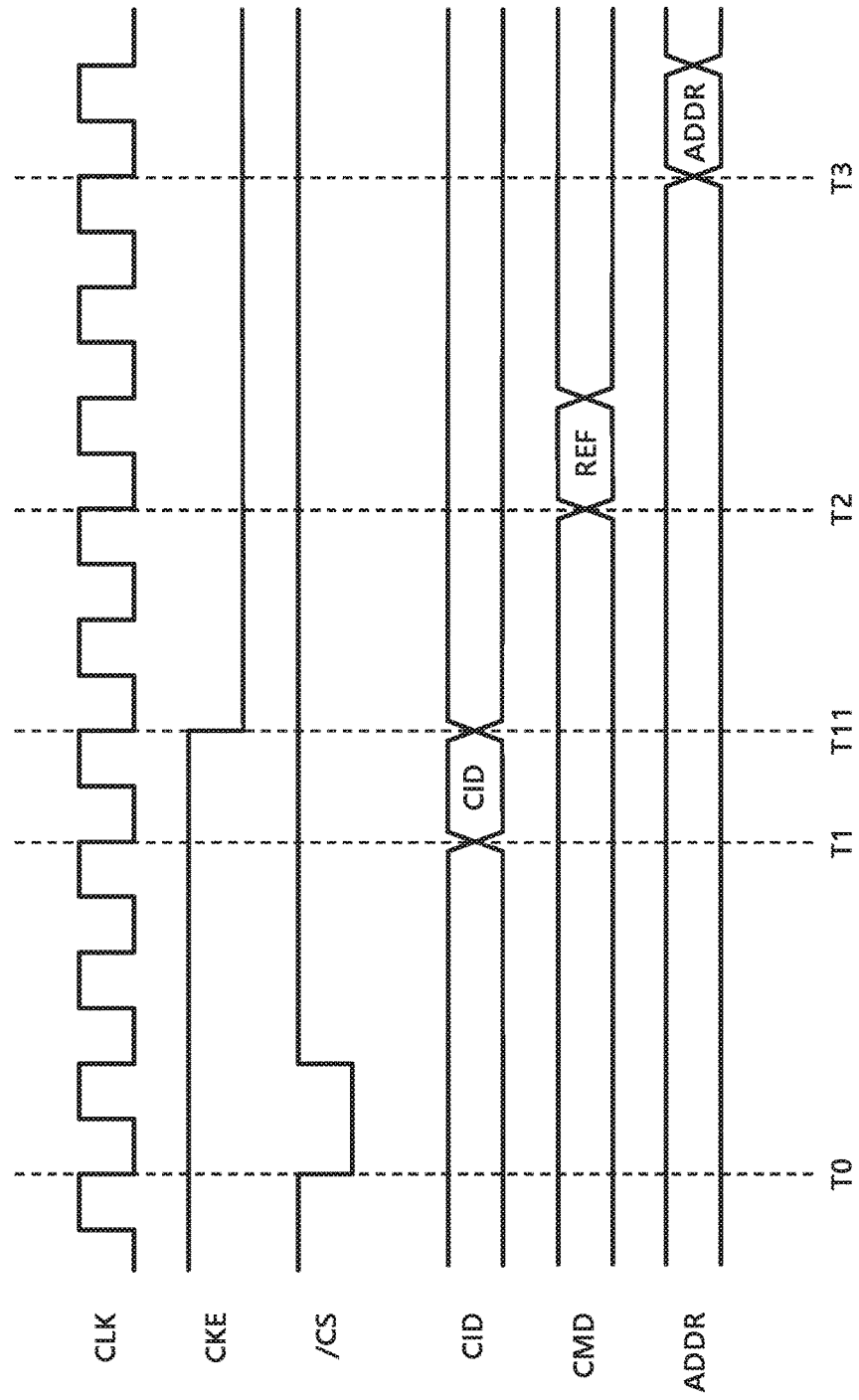

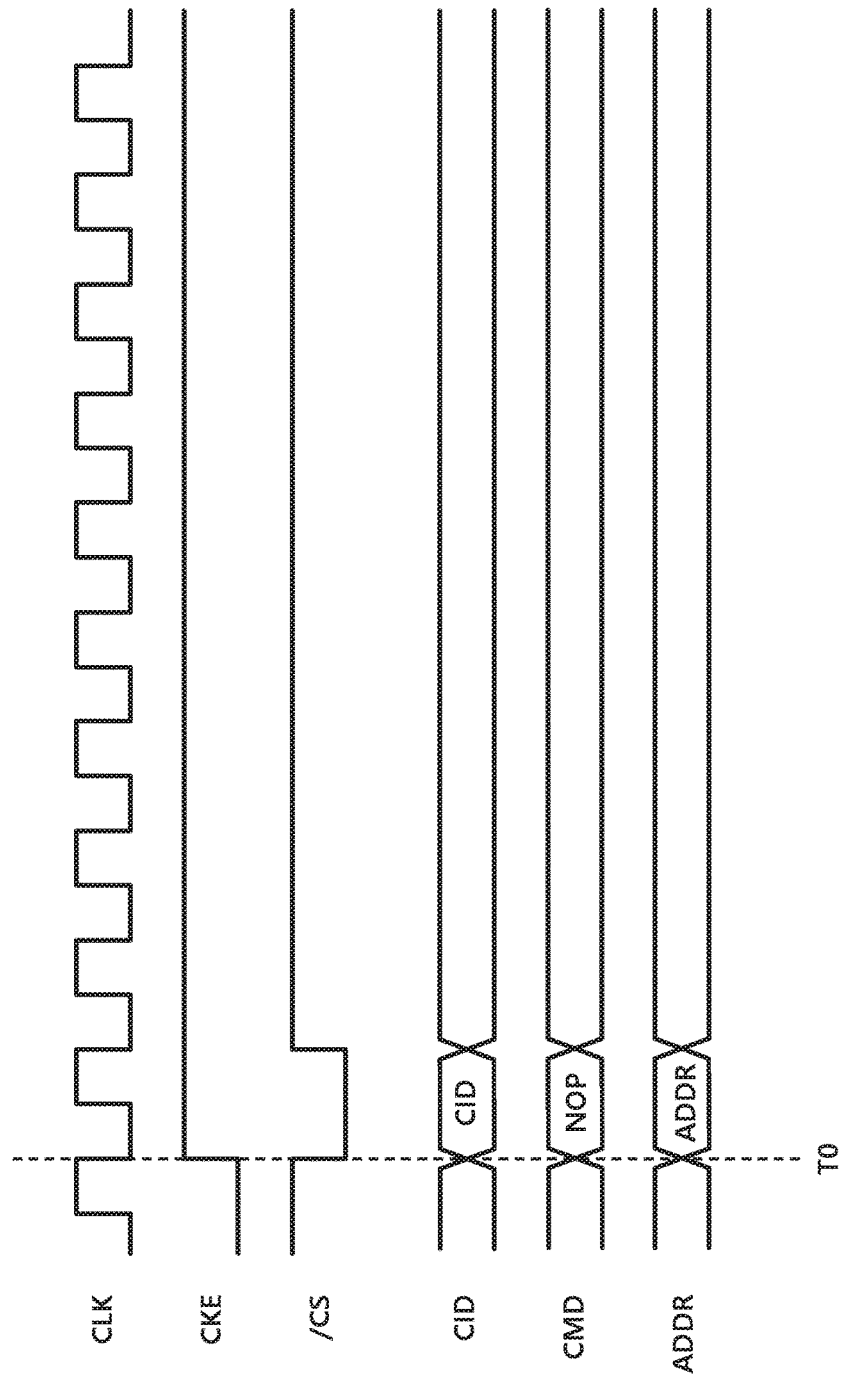

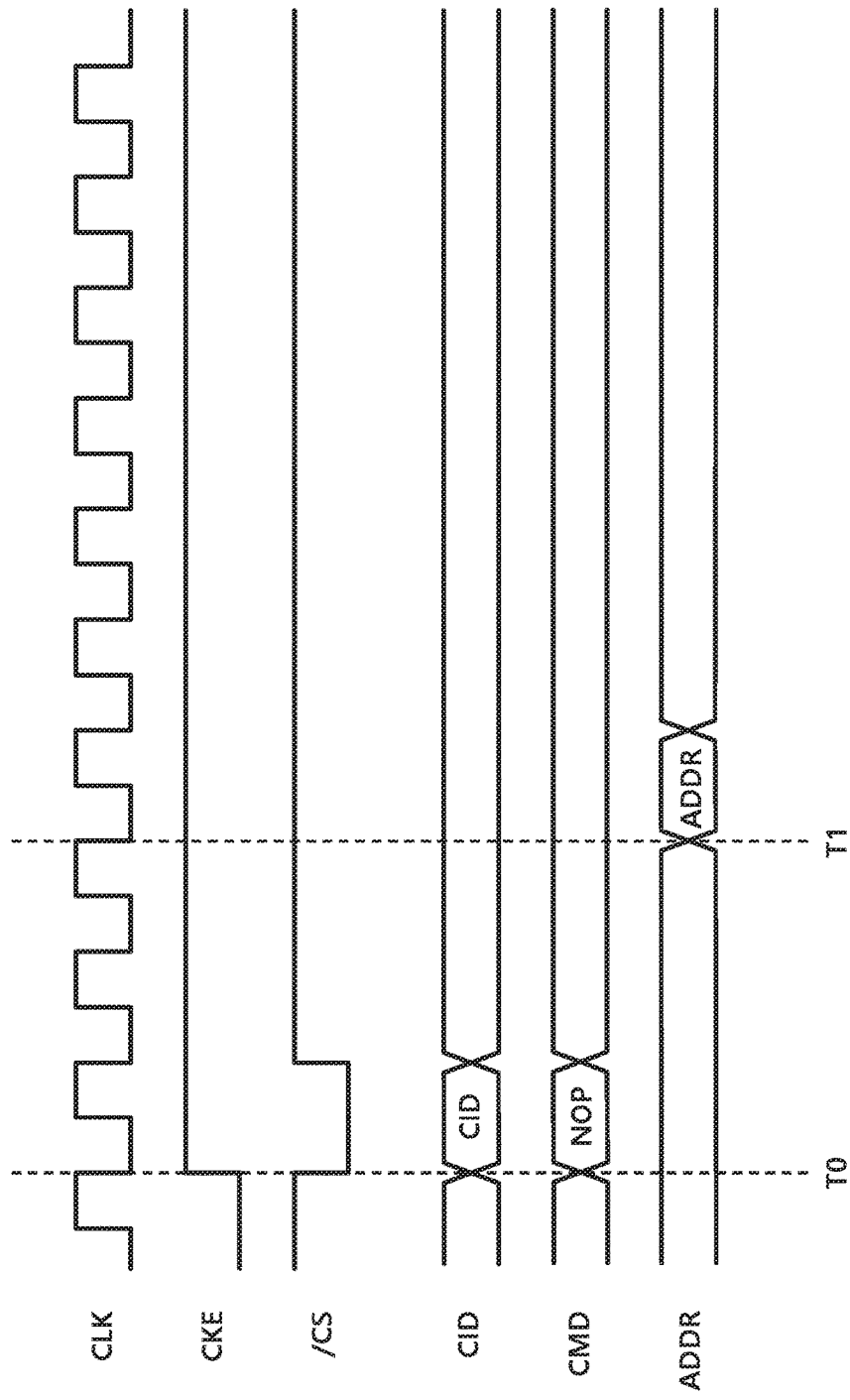

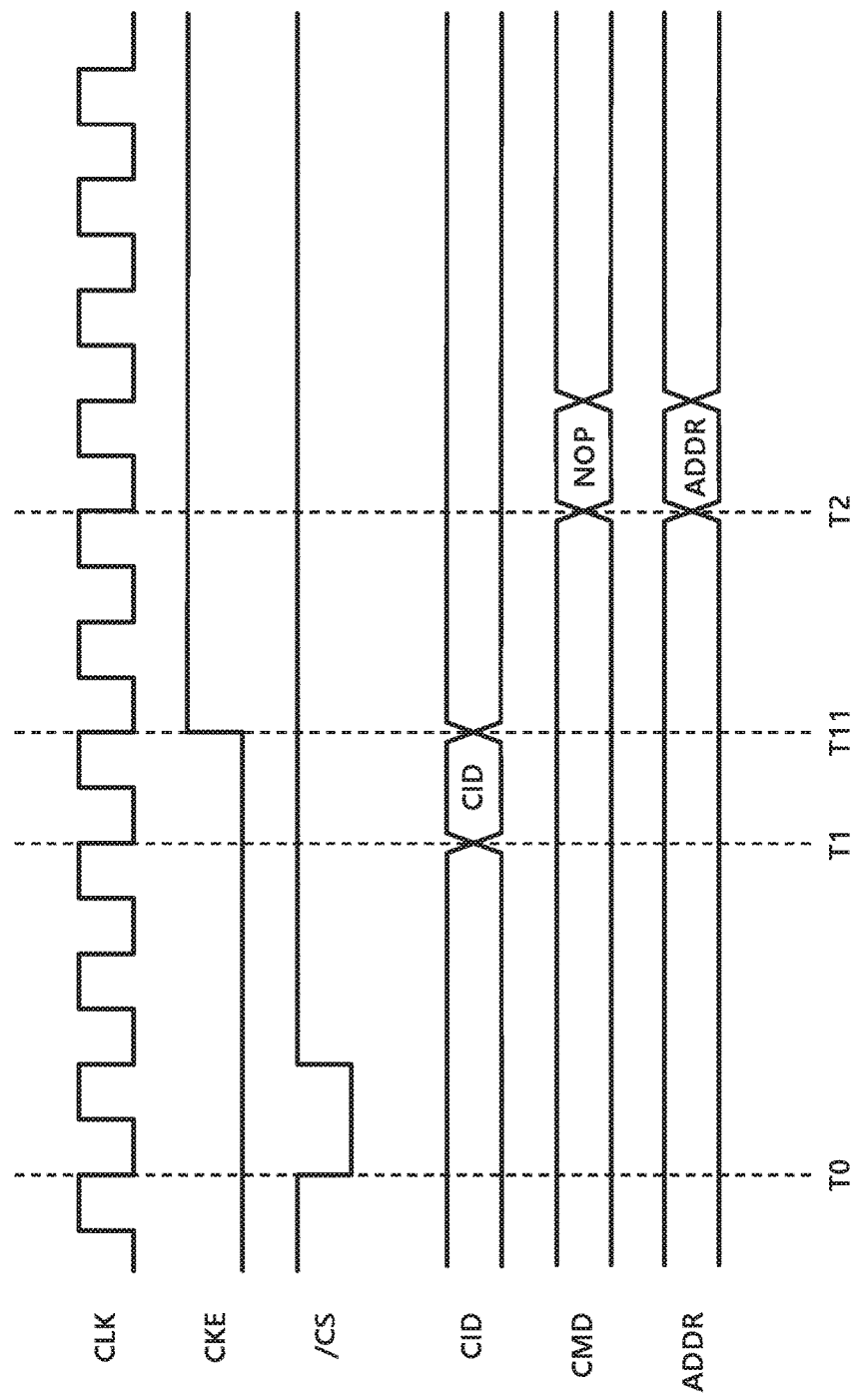

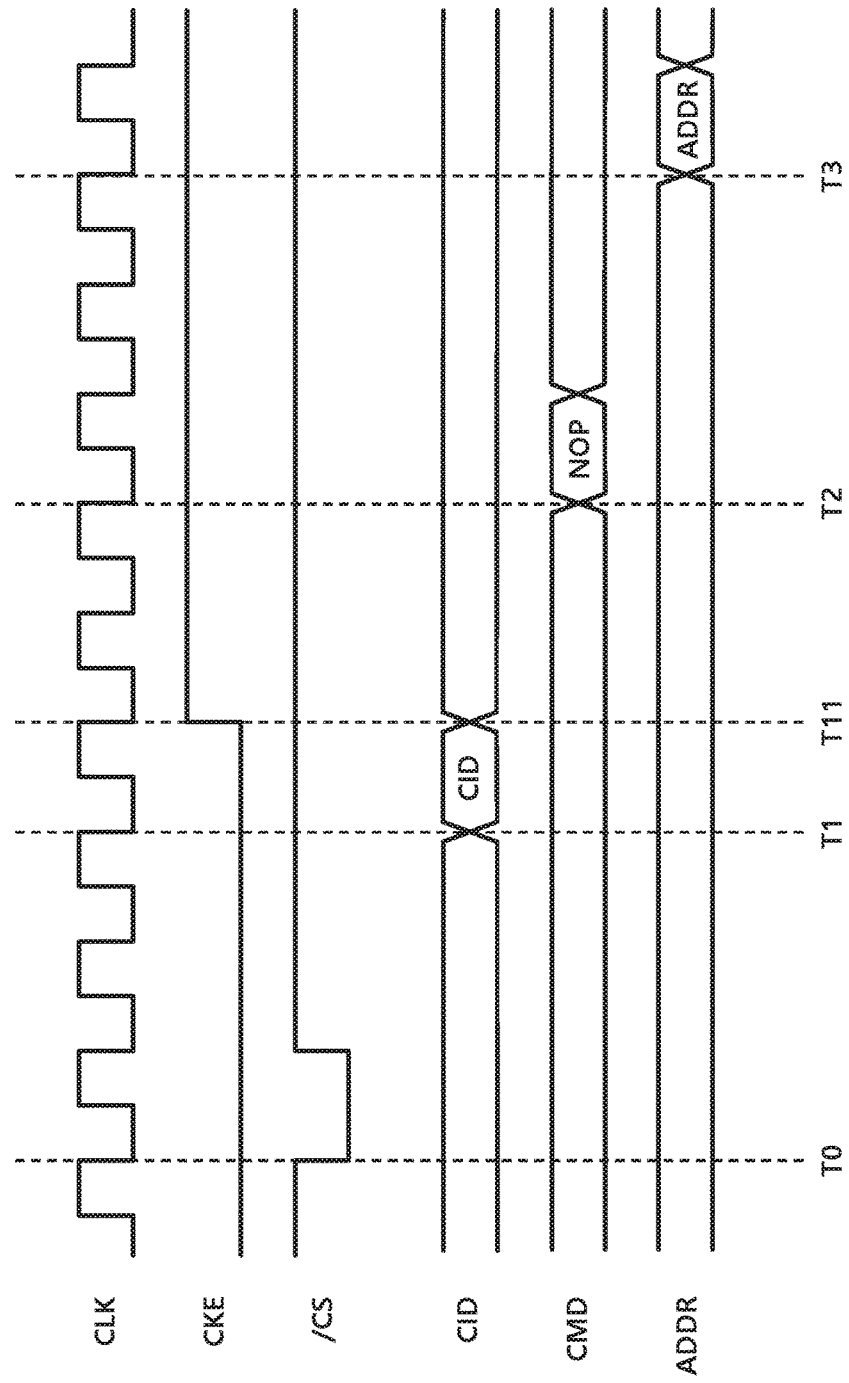

MEMORY CHIP WITH REDUCED POWER CONSUMPTION, BUFFER CHIP MODULE CONTROLLING THE SAME AND MEMORY MODULE INCLUDING THE SAME

CROSS-REFERENCE RELATED APPLICATIONS

The present application claims priority of Korean Patent Application No. 10-2017-0121949, filed on Sep. 21, 2017, which is incorporated herein by reference in its entirety.

BACKGROUND

1. Technical Field

Various examples of embodiments may generally relate to a memory chip with reduced power consumption, a buffer chip module controlling the memory chip, and a memory module including the memory chips.

2. Related Art

FIG. 1 is a block diagram illustrating a conventional memory system.

The conventional memory system includes a memory module 10 and a host 20 controlling the memory module 10.

The memory module 10 includes a plurality of memory chips 11-1, 11-2, 11-3, and 11-4 and a buffer chip 12.

In FIG. 1, the memory chips 11-1, 11-2, 11-3, and 11-4, constitute one rank.

In order to maintain signal quality when a plurality of ranks are connected to a channel, the buffer chip 12 is included in a memory module and the host 20 controls the memory chips 11-1, 11-2, 11-3, and 11-4 via the buffer chip 12 rather than the buffer chips 12 directly controlling the memory chips 11-1, 11-2, 11-3, and 11-4.

At this time, the buffer chip 12 buffers a control signal and a data signal applied from the host 20 and provides them to the memory chips.

Each memory chip includes various types of buffers such as a chip selection buffer, a command buffer, and an address buffer.

Conventionally, all the buffers of all the memory chips are kept in the activated state, and standby power is consumed even if only some of the memory chips of the memory module 10 are used. In other words all the buffers of all memory chips are turned on and remain on.

In recent years, a large number of memory chips have been used in the memory module 10 and the power consumption is therefore further increased.

Accordingly, a technique for reducing standby power in a memory chip and a memory module 10 is required.

SUMMARY

In an embodiment, a memory chip may include a chip select (CS) buffer configured to receive a chip select signal; and a command (CMD) buffer configured to receive a command signal, wherein the command signal is input after a time has elapsed since the chip select signal is activated and the CMD buffer is turned on when the command signal is input.

In an embodiment, a buffer chip module may include a control signal queue configured to receive a control signal divided into a chip select signal, a command signal, an address signal, and to store the chip select signal, the command signal, and the address signal; and an arbiter configured to output control signals stored in the control signal queue according to a predetermined timing condition, wherein the arbiter outputs the command signal after a time has elapsed since the chip select signal is activated.

In an embodiment, a memory module may include a plurality of memory chips each including a chip select (CS) buffer buffering a chip select signal, a chip identification (CID) buffer buffering a chip identification signal, a command (CMD) buffer buffering a command signal and an address (ADDR) buffer buffering an address signal; and a buffer chip module configured to output the chip select signal, the chip identification signal, the command signal, and the address signal to the plurality of memory chips, wherein the buffer chip module outputs the chip identification signal when the chip select signal is activated or when a predetermined time has elapsed since the chip select signal is activated, and a CMD buffer and an ADDR buffer included in a memory chip among the plurality of memory chips which keeps being turned off before the chip select signal is activated.

BRIEF DESCRIPTION OF THE DRAWINGS

FIGS. 6 to 17 are timing diagrams illustrating operations of a memory chip and a buffer chip module according to an embodiment of the present disclosure.

DETAILED DESCRIPTION

Various embodiments will be described below with reference to the accompanying drawings.

Figure 1:
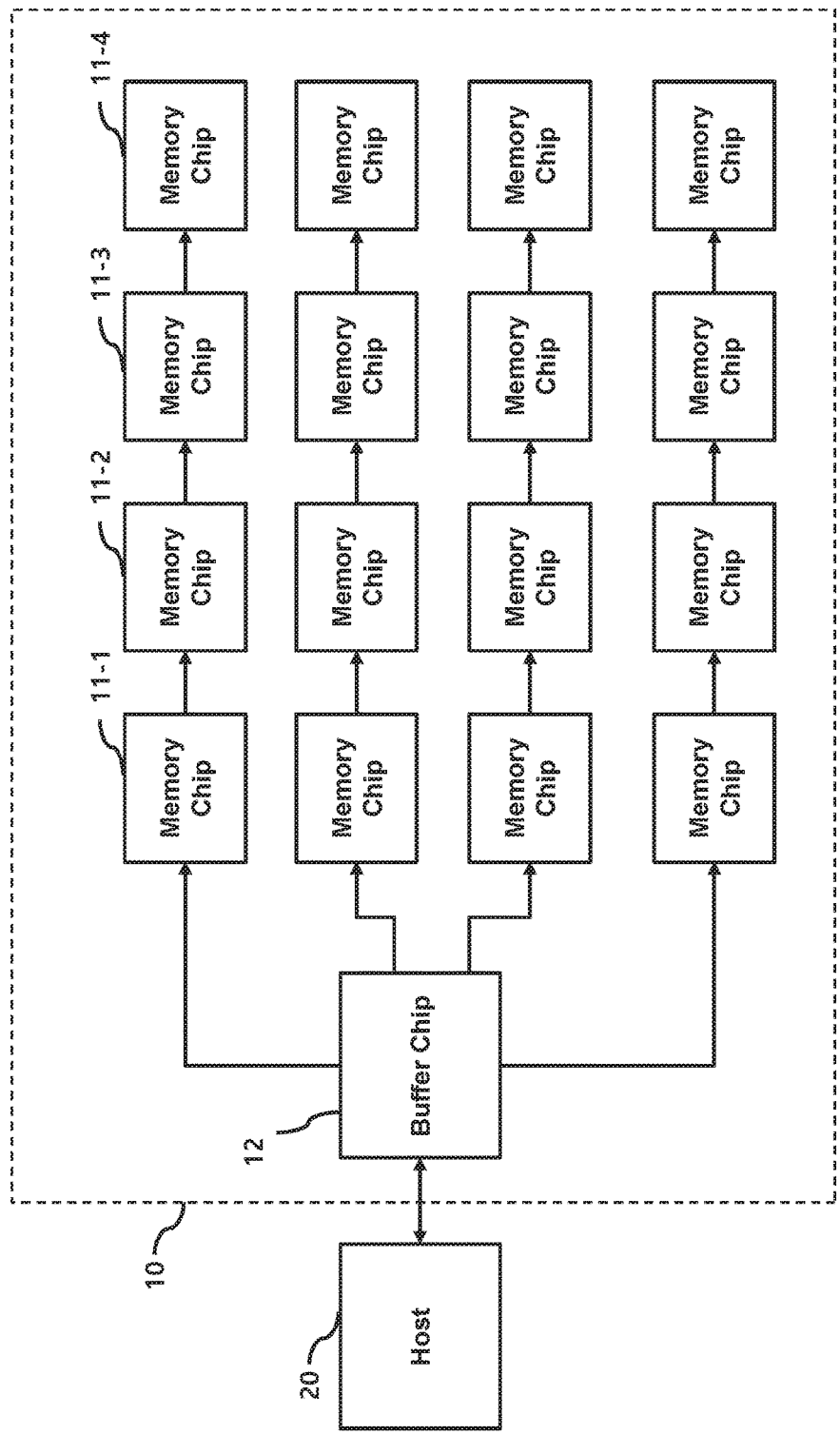
FIG. 1 is a block diagram illustrating a conventional memory system.
Figure 2:
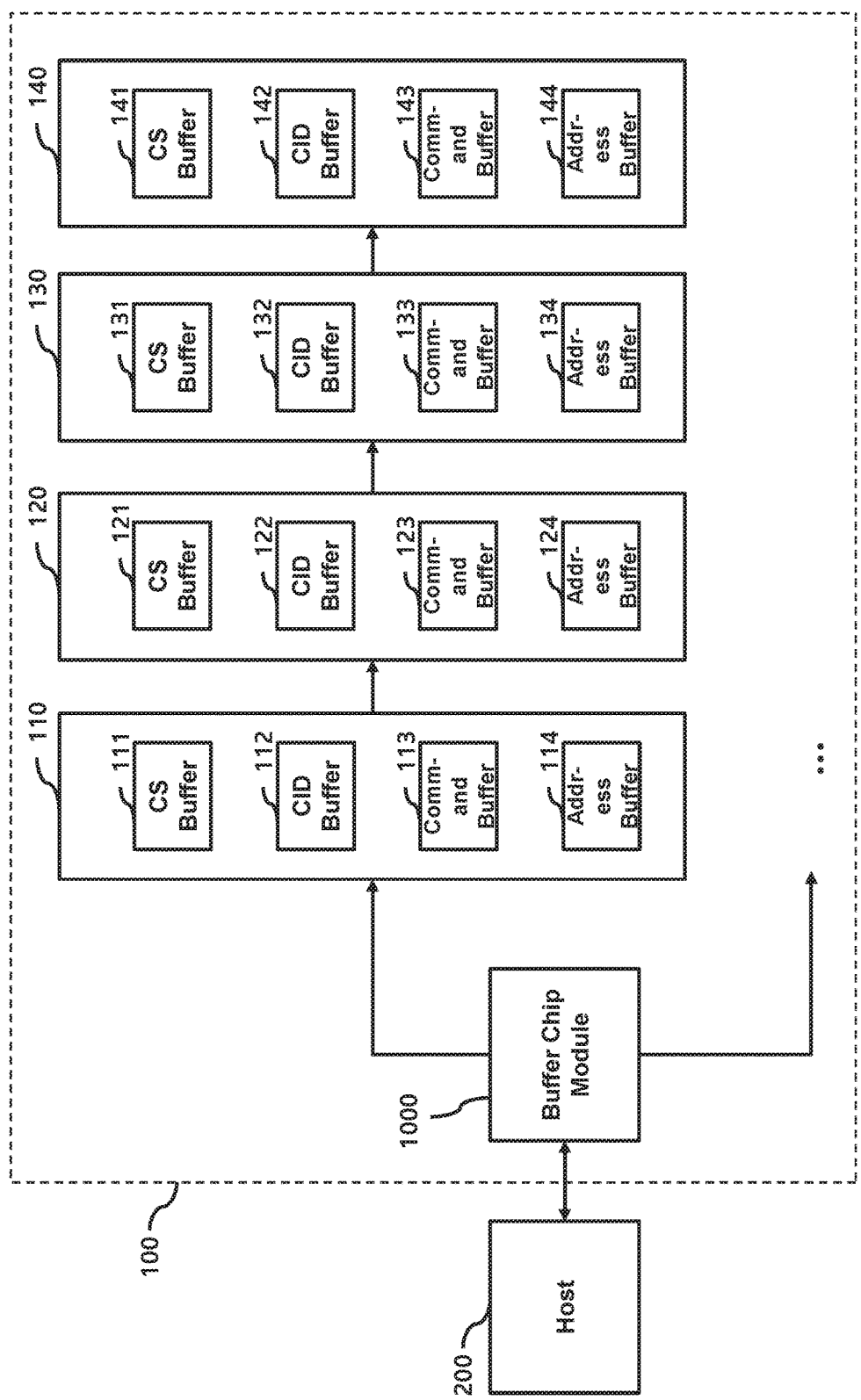
FIG. 2 is a block diagram illustrating a memory system in accordance with an embodiment of the present disclosure.

FIG. 2 is a block diagram illustrating a memory system in accordance with an embodiment of the present disclosure.

The memory system according to an embodiment of the present disclosure includes a memory module 100 and a host 200.

The host 200 may be implemented as a memory controller or a processor including a memory controller therein.

The memory module 100 is connected to the host 200 through a channel and transmits and receives a control signal and a data signal.

The memory module 100 may include one or more ranks.

In this embodiment, the memory module 100 includes a plurality of memory chips 110, 120, 130, and 140 included in the same rank.

The plurality of memory chips 110, 120, 130, and 140 may be manufactured as independent chips, or may be fabricated in a multi-chip package and included in one semiconductor chip.

The memory chip 110 includes a CS (Chip Select) buffer 111, a CID (Chip Identification) buffer 112, a command buffer 113, and an address buffer 114. Herein, only one memory chip 110 may be cited, but the associated description may apply to the one memory chip 110 and/or to any one or more of the other memory chips 120, 130, and 140. This also applies to the CS buffer 111, the CID buffer 112, the command buffer 113, and the address buffer 114. The CS buffer 111 may be cited, but the associated description may apply to the CS buffer 111 and/or to any buffer 112, 113, and 114 associated with any one or more of the memory chips 110, 120, 130, and 140.

The CS buffer 111 is always turned on.

The CID buffer 112 may be turned on simultaneously with the CS buffer 111 or turned on after the CS buffer 111 is turned on according to a setting.

In the present disclosure, the command buffer 113 and the address buffer 114 are not turned on in all the memory chips.

For example, the command buffer 113 and the address buffer 114 are turned on only in the memory chip corresponding to the CID signal input to the CID buffer 112, and are not turned on in other memory chips.

Accordingly, the power consumption due to keeping command buffer 113 and the address buffer 114 in a turned-on state can be reduced.

In this embodiment, it is assumed that the command buffer and the address buffer of the memory chip 110 are turned on and the command buffers and address buffers included in the other memory chips 120, 130, and 140 are not turned on.

The command buffer 113 may be turned on at the same time as the CS buffer 111 or turned on after the CS buffer 111 is turned on according to a setting.

The command buffer 113 may be turned on at the same time as the CID buffer 112 or after the CID buffer 112 is turned on.

The address buffer 114 may be turned on simultaneously with the command buffer 113 or after the command buffer 113 is turned on according to a setting.

The memory module 100 according to the present embodiment further includes a buffer chip module 1000.

The buffer chip module 1000 controls memory chips included in one or more ranks that share a channel connected to the host 200.

As described above, the memory chips 110 to 140 are memory chips included in one rank.

The buffer chip module 1000 can transmit and receive control signals and data between the host 200 and the memory chips.

That is, the buffer chip module 1000 can buffer the write data provided from the host 200 and provide the buffered write data to the memory chip, buffer the read data output from the memory chip, and output the buffered read data to the host 200.

The buffer chip module 1000 buffers control signals which include the CS, CID, CMD, and ADDR signals received from the host 200 and provides the CS, CID, CMD, and ADDR signals to the memory chip.

The buffer chip module 1000 may set different timing for outputting control signals to the memory chip for each control signal.

The buffer chip module 1000 outputs the chip select signal CS to the memory chip, and outputs a chip identification signal CID to the memory chip after a predetermined time has elapsed. The CS buffer 111 may receive the chip select signal CS. Further, the CID buffer 112 may receive the chip identification signal CID.

The buffer chip module 1000 outputs the chip identification signal CID to the memory chip and outputs the command signal CMD to the memory chip after a predetermined time has elapsed. The CID buffer 112 may receive the chip identification signal CID. Further, the command buffer 113 may receive the command signal CMD.

The buffer chip module 1000 outputs the command signal CMD to the memory chip and outputs the address signal ADDR to the memory chip after a predetermined time has elapsed. The command buffer 113 may receive the command signal CMD. Further, the address buffer 114 may receive the address signal ADDR.

At this time, the time interval between the respective signals can be set in advance.

The timing of outputting each control signal must match the timing of activating a buffer corresponding to the control signal in the memory chip.

Accordingly, the output timing of each of the previously set signals must be set in advance in the memory chip.

The buffer chip module 1000 may buffer the clock signal CLK and the clock enable signal CKE provided from the host 200 and provide the buffered signals to the memory chip 110.

In the following block diagram, the clock signal CLK and the clock enable signal CKE are not separately displayed.

In the embodiment of FIG. 2, the buffer chip module 1000 is included in the memory module 100, but in other embodiments, the buffer chip module may be embedded in the host.

Figure 3:
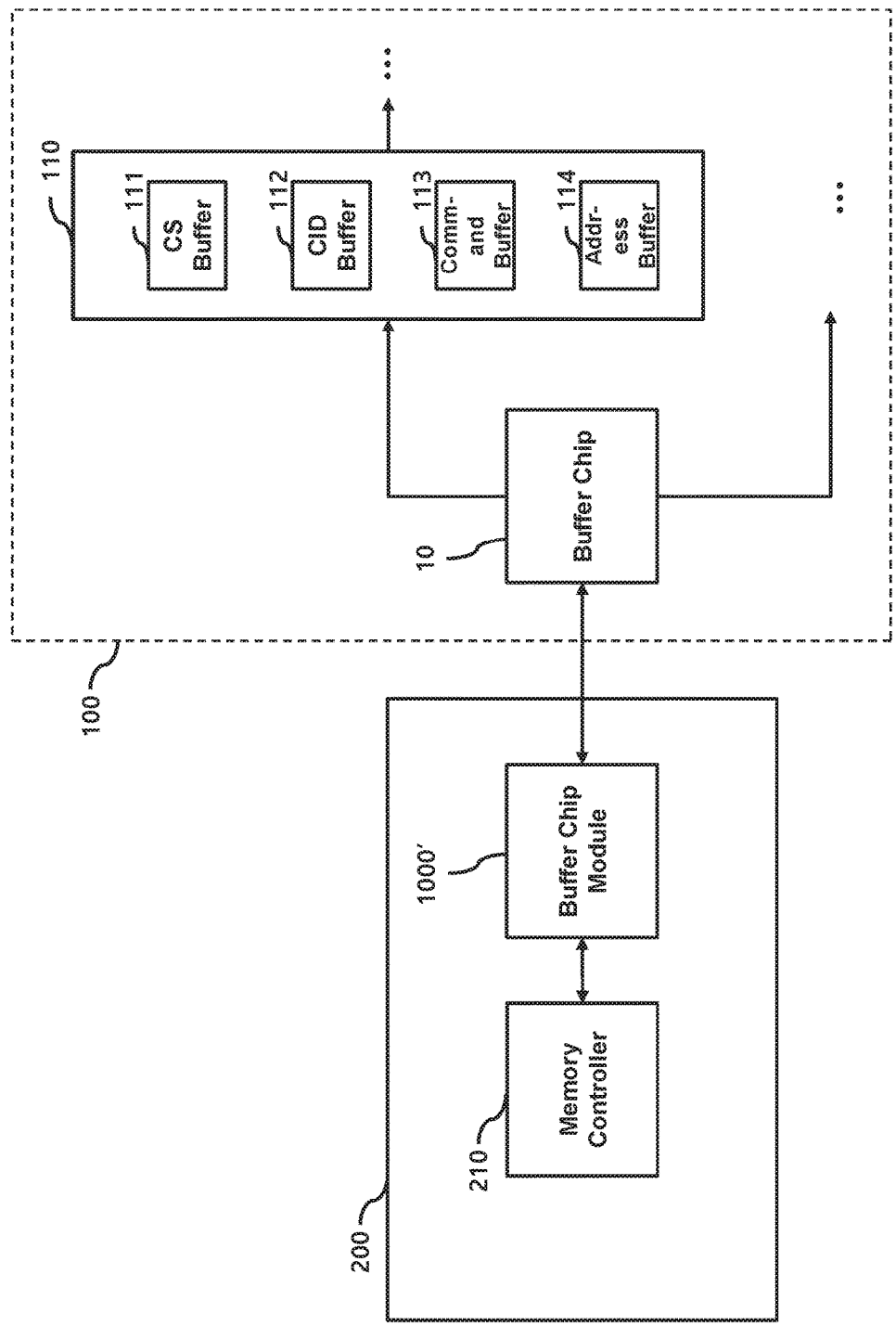
FIG. 3 is a block diagram illustrating a memory system in accordance with another embodiment of the present disclosure.

FIG. 3 is a block diagram illustrating a memory system in accordance with another embodiment of the present disclosure.

FIG. 3, the host 200 includes a memory controller 210 and a buffer chip module 1000'.

The buffer chip module 1000' performs substantially the same function as the buffer chip module 1000 of FIG. 2.

The memory module 100 may include a separate buffer chip as disclosed in FIG. 2 to buffer signals from output from the buffer chip module 1000'.

If there is no problem with the signal quality, the separate buffer chip may be omitted.

Figure 4:
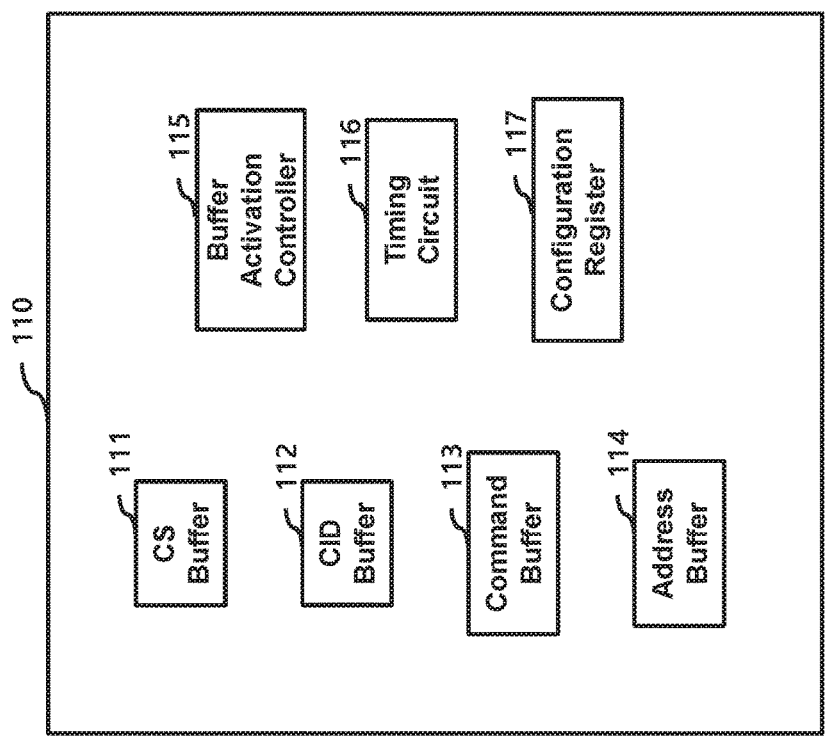
FIG. 4 is a block diagram of a memory chip according to an embodiment of the present disclosure.

FIG. 4 is a block diagram of a memory chip 110 according to an embodiment of the present disclosure.

The memory chip 110 according to an embodiment of the present invention includes a CS buffer 111, a CID buffer 112, a command buffer 113, and an address buffer 114 as described above.

The memory chip 110 according to an embodiment of the present disclosure may further include a buffer activation controller 115, a timing circuit 116, and a configuration register 117.

The buffer activation controller 115 controls activation of the CS buffer 111, the CID buffer 112, the command buffer 113, and the address buffer 114.

The buffer activation controller 115 controls activation timing of the buffers 111, 112, 113, and 114 so that the control signals corresponding to the buffers 111, 112, 113, and 114 can be normally input.

For example, before the command signal is input, the command buffer 113 remains off. When the command signal is input, the command buffer 113 is turned on. Thus, the time that the command buffer 113 is turned on, can be reduced.

The power consumption in the address buffer 114 can be reduced by activating the address buffer 114 at a time after the command buffer 113 is activated.

The buffer activation control unit 115 may refer to the timing circuit 116 and the configuration register 117.

The configuration register 117 may store timing information on whether to control the timing of activating each buffer differently and the timing of activation. In one example, the configuration register 117 may store timing information about activation of the command buffer 113 and the address buffer 114.

In the case of a DRAM, the configuration register 117 may be included as a part of the mode register set, but may be included in a separate element according to the embodiment.

The configuration register 117 can be set according to a separate program command.

In one embodiment, the configuration register 117 may be set to have a predetermined timing condition before the memory chip 110 is mounted to the memory module 100.

In another embodiment, the configuration register 117 may be set under control of the buffer chip module 1000 in a state in which the configuration register 117 is mounted on the memory chip 110.

The configuration register 117 can be set so that all buffers are always turned on. In this case, the memory chip 110 can operate in a conventional manner.

The configuration register 117 can set timing information between a time when each buffer is turned on and time when the chip select signal CS is applied.

The timing circuit 116 determines whether a time beyond the set time has elapsed.

In this manner, the buffer activation controller 115 can activate or deactivate each buffer according to a preset timing condition with reference to the configuration register 117 and the timing circuit 116. In one example, the buffer activation controller 115 may control activation of the command buffer 113 and the address buffer 114, where the command buffer 113 and the address buffer 114 may refer to the configuration register 117 to get timing information about the activation of the CMD buffer 113 and the address buffer 114.

The buffer activation controller 115 may possibly not activate the address buffer 114 for commands that do not require an address signal, where a command that requires an address signal may be determined based on the type of the command signal.

Figure 5:
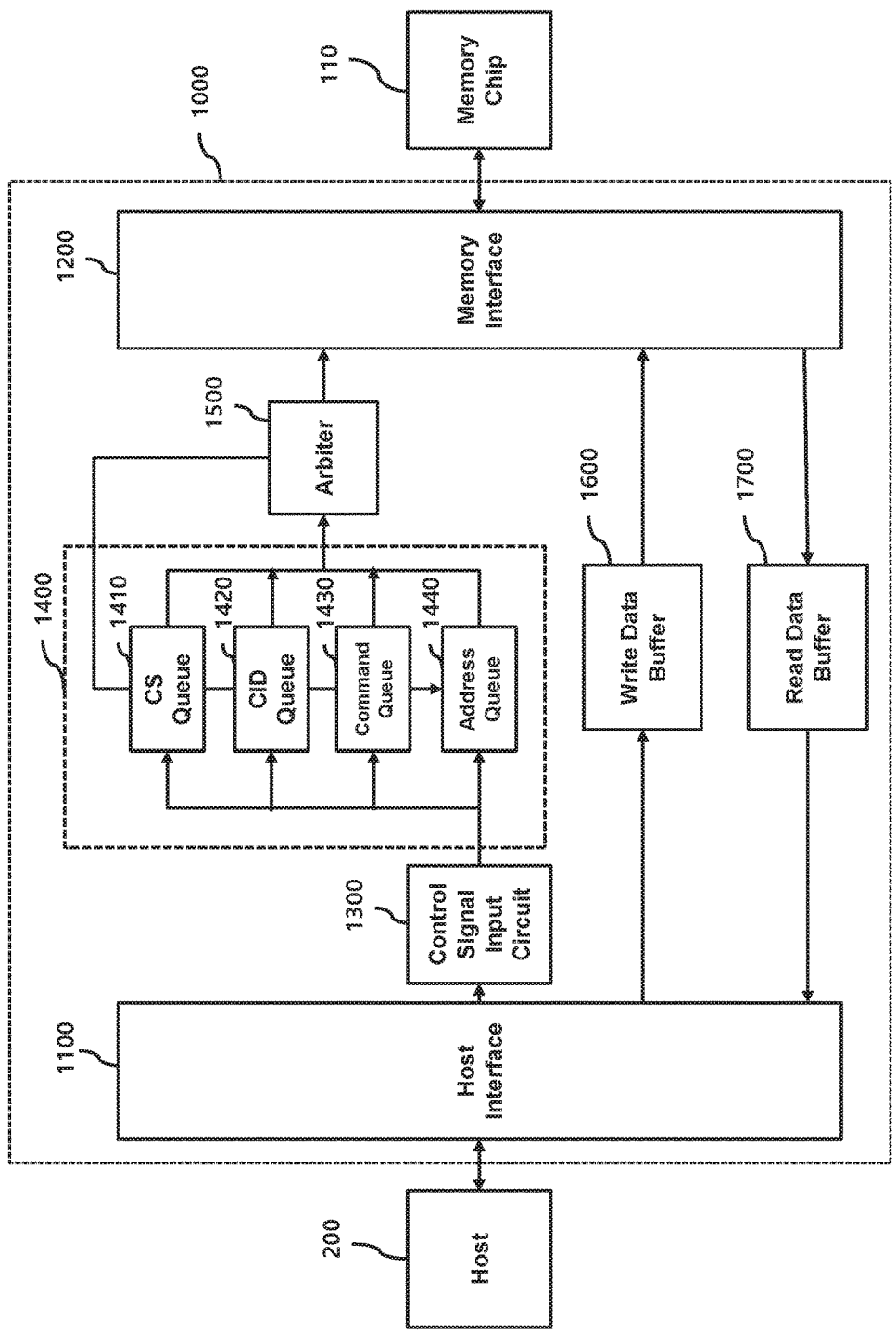
FIG. 5 is a block diagram of a buffer chip module according to an embodiment of the present disclosure.

FIG. 5 is a block diagram of a buffer chip module 1000 according to an embodiment of the present disclosure.

The embodiment of FIG. 5 corresponds to the embodiment in which the buffer chip module 1000 is included in the memory module 100 as shown in FIG. 2.

In the embodiment of FIG. 3, the buffer chip module 1000' may have substantially same configuration as the buffer chip module 1000 of FIG. 5.

The buffer chip module 1000' in the embodiment of FIG. 3 interfaces with the memory controller 210 included in the host 200 of FIG. 3 instead of the host 200 of FIG. 5.

Referring to FIG. 5, the buffer chip module 1000 includes a host interface 1100 for transmitting and receiving control signals and data signals to and from the host 200 and a memory interface 220 for transmitting and receiving control signals and data signals to and from the memory chip 110.

The buffer chip module 1000 includes a control signal input circuit 1300, a control signal queue 1400, an arbiter 1500, a write data buffer 1600, and a read data buffer 1700.

The control signal queue 1400 includes a plurality of sub-queues corresponding to the types of control signals.

The control signal queue 1400 includes a CS queue 1410 that queues the chip select signal CS, a CID queue 1420 that queues the chip identification signal CID, a command queue 1430 that queues the command signal CMD, and an address queue 1440 for queuing the address signal ADDR.

The control signal input circuit 1300 divides the control signals input from the host interface 1100 according to types and inputs the divided control signals into the control signal queue 1400.

The control signal input circuit 1300 inputs a chip select signal to the CS queue 1410 and inputs the chip identification signal of the control signal to the CID queue 1420 and inputs the command signal to the command queue 1430, and inputs the address signal to the address queue 1440.

The arbiter 1500 outputs control signals stored in the control signal queue 1400 to the memory interface 1220 according to predetermined timing conditions.

The arbiter 1500 outputs a chip identification signal CID, a command signal, and an address signal in sequence according to a predetermined timing condition after outputting the chip select signal CS. In one example, the arbiter 1500 may output the command signal CMD after time has elapsed since the chip select signal CS is activated. Further, the arbiter 1500 may output the address signal ADDR after time has elapsed since the command signal CMD is output. Still further, the arbiter 1500 may output the chip identification signal CID before outputting the command signal CMD and after the chip select signal CS is activated.

At this time, the timing condition in which the control signals are sequentially output from the arbiter 1500 should match the timing condition set in the configuration register 117 of the memory chip 110 in FIG. 4.

For example, the CID buffer 112 of the memory chip 110 must be turned on when the chip identification signal CID is output, the command buffer 113 must be turned on when the command signal is output, the address buffer must be turned on when the address signal is output.

The write data buffer 1600 buffers a data signal input from the host interface 1100 and outputs a buffered data signal to the memory interface 1200.

The read data buffer 1700 buffers a data signal input from the memory interface 1200 and outputs a buffered data signal to the host interface 1100.

FIGS. 6 to 17 are timing diagrams illustrating operations of the memory chip and the buffer chip module according to an embodiment of the present disclosure.

As described above, the command buffers and the address buffers included in the memory chips that do not correspond to the chip identification signal maintain the off state, thereby reducing power consumption. In other words, the command buffers and address buffers may maintain an off state when the chip identification signal does not correspond to the memory chip.

Hereinafter, an embodiment of the present disclosure will be described on the assumption that a chip identification signal corresponding to the memory chip 110 is applied.

FIGS. 6 to 9 correspond to the case where the clock enable signal CKE is maintained at a high level so that the memory chip performs a general read or write operation.

Figure 6:
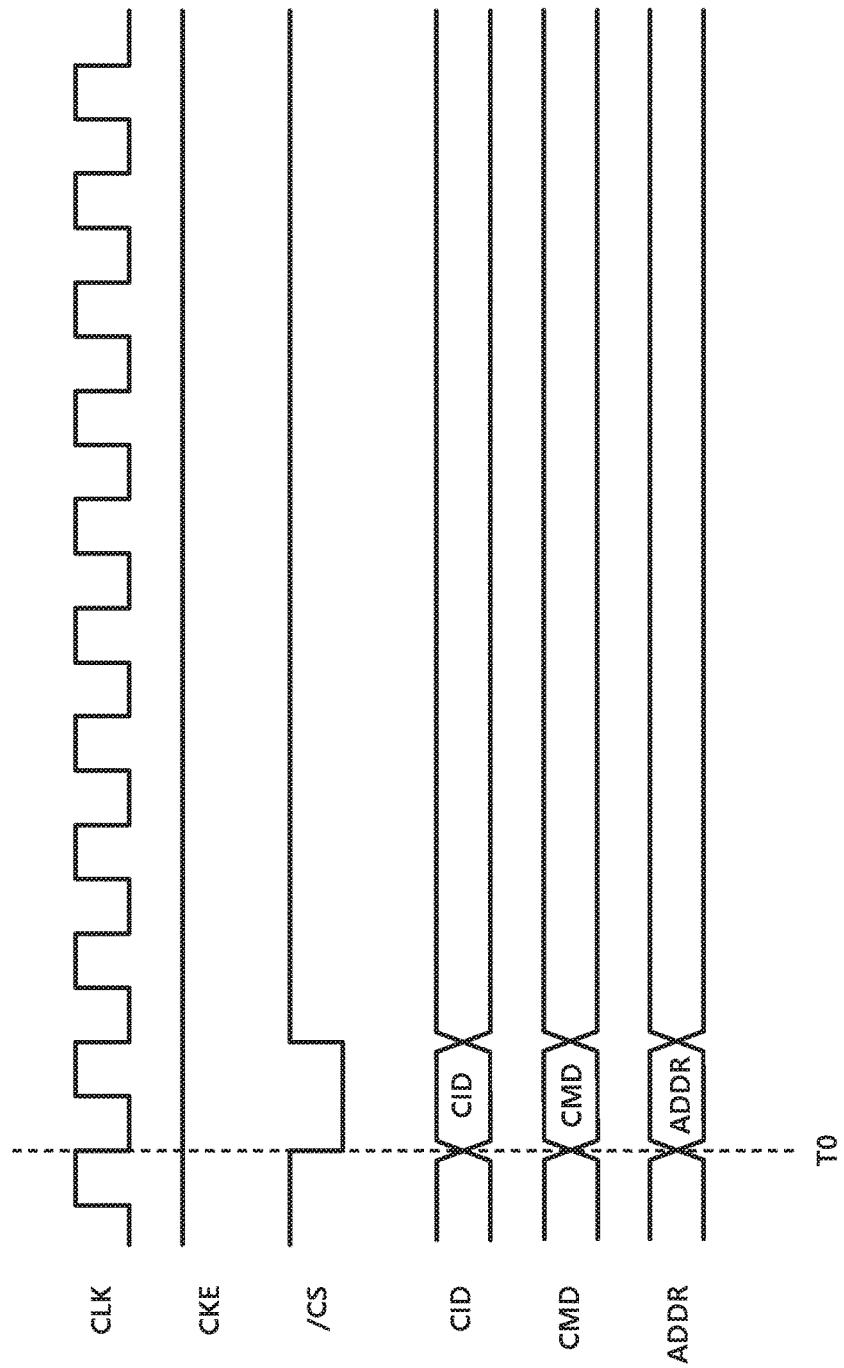

In FIG. 6, the buffer chip module 1000 starts to output the chip identification signal CID, the command signal CMD, and the address signal ADDR at time T0 when the chip select signal CS is activated.

In FIG. 6, the memory chip 110 always turns on and leaves on the CS buffer 111, the CID buffer 112, the command buffer 113, and the address buffer 114.

Figure 7:
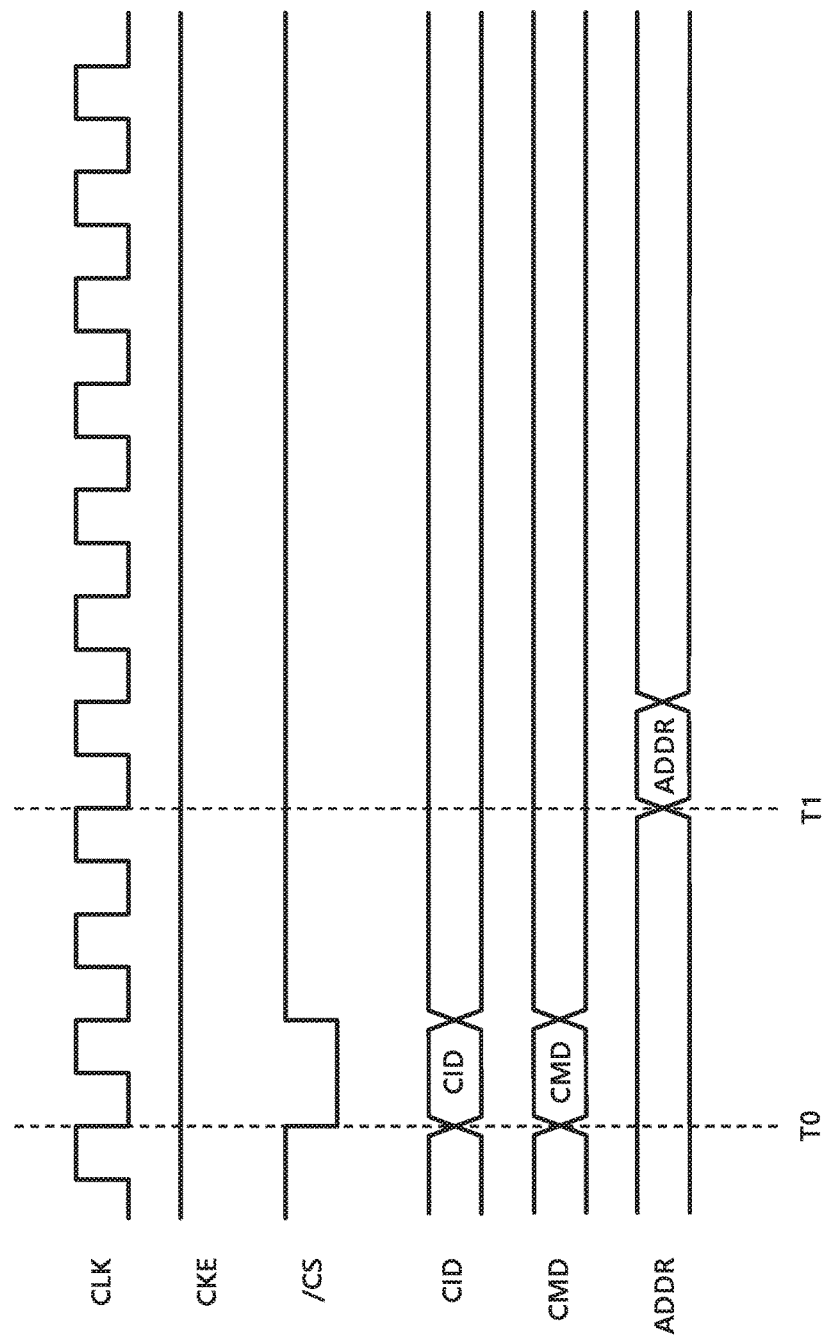

FIG. 7 shows an operation of outputting a chip identification signal CID and a command signal CMD at time T0 when a chip select signal CS is activated, and outputting an address signal at time T1 when a predetermined time has elapsed from time T0.

In FIG. 7, the memory chip 110 always turns on and leaves on the CS buffer 111, the CID buffer 112, and the command buffer 113 at time T0, and the memory chip 110 turns on the address buffer at time T1 when the address signal ADDR is input, and power consumption is therefore reduced.

Figure 8:
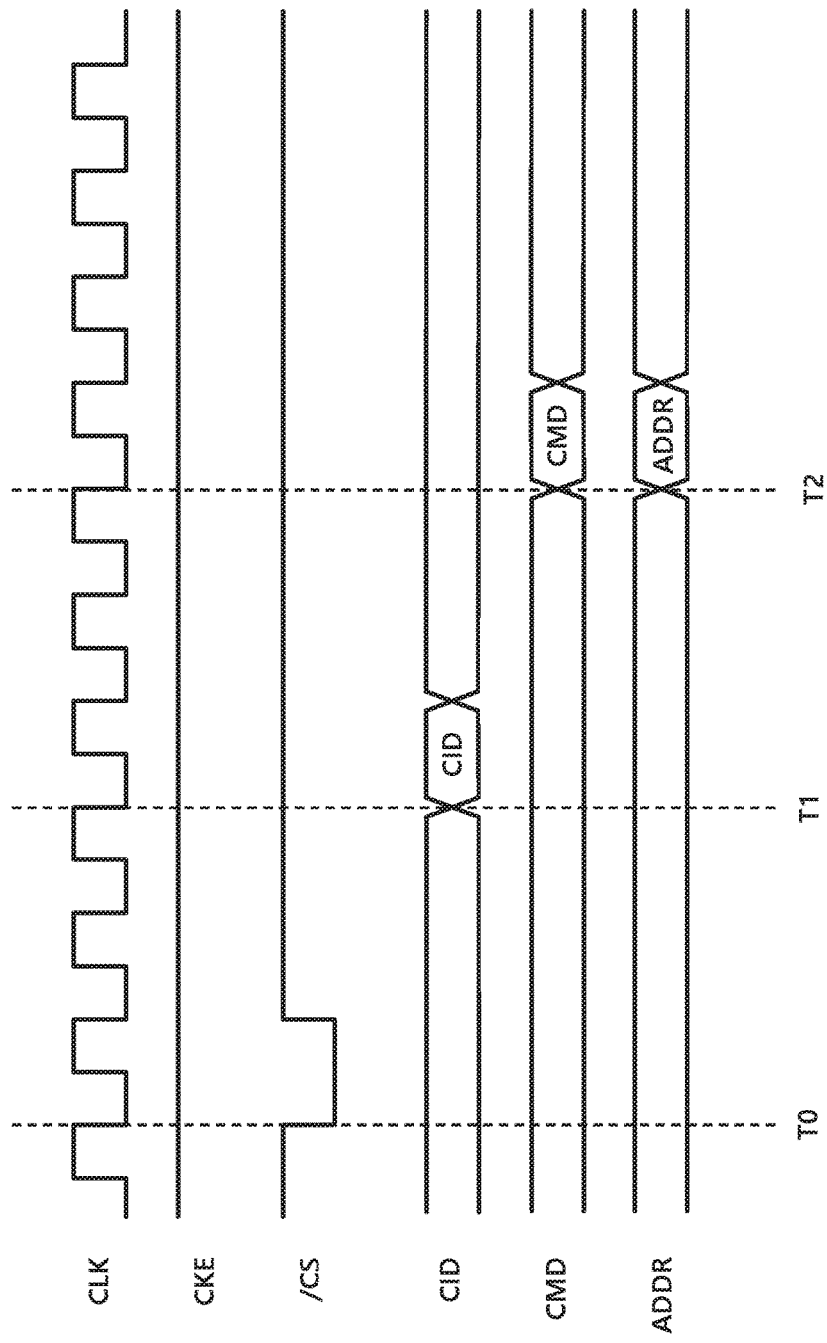

FIG. 8 is a timing diagram showing operation of the buffer chip module 1000 when the buffer chip module 1000 outputs a chip identification signal CID at time T1 when a predetermined time has elapsed from time T0 when the chip select signal CS is activated, and starts outputting the command signal CMD and the address signal ADDR at time T2 when a predetermined time has elapsed from time T1 when the chip identification signal CID is output.

In FIG. 8, the memory chip 110 always turns on and leaves on the CS buffer 111 at time T0, turns on the CID buffer 112 at time T1, and turns on the CMD buffer 113 and ADDR buffer 114 at time T2, and power consumption is therefore reduced.

Figure 9:
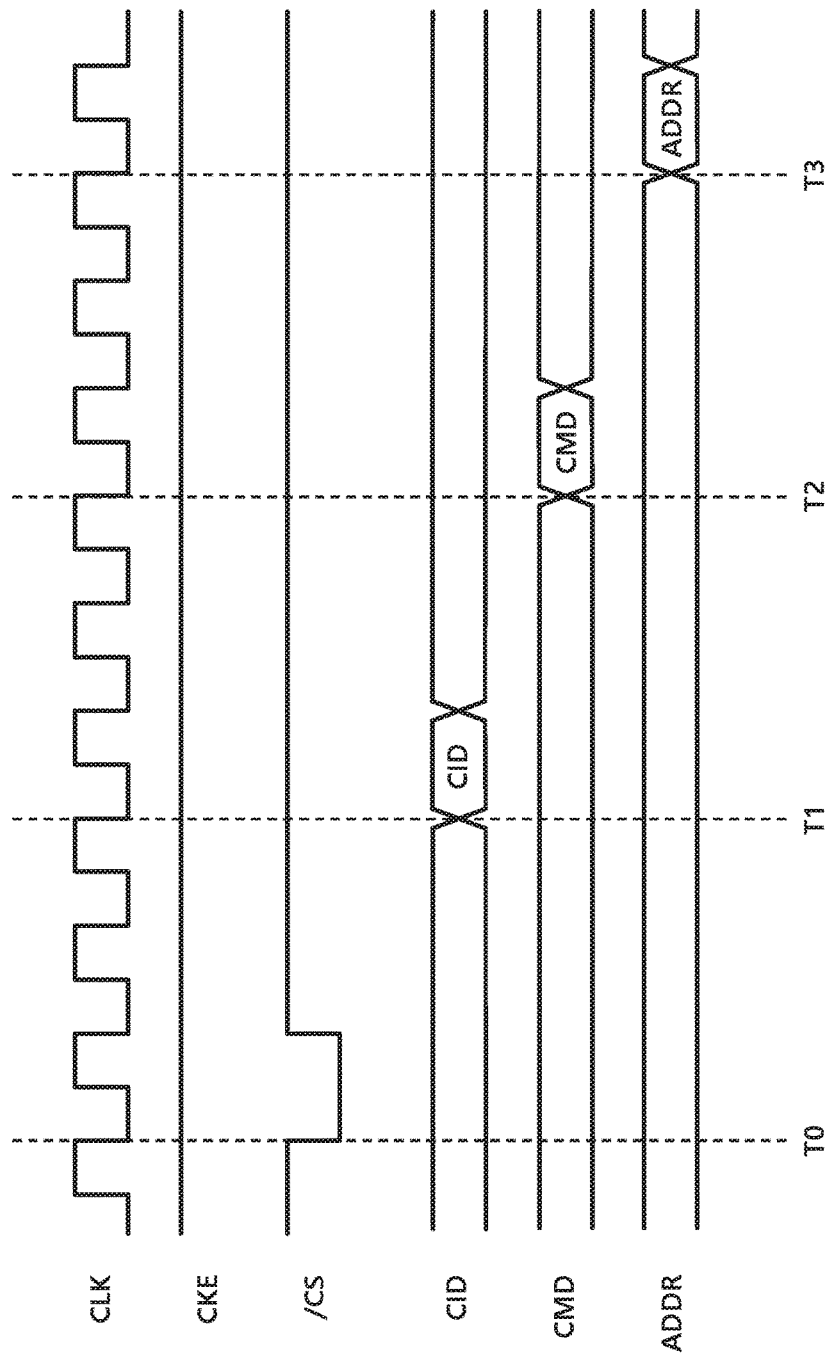

FIG. 9 is a timing diagram showing operation of the buffer chip module 1000 when the buffer chip module 1000 outputs a chip identification signal CID at time T1 when a predetermined time has elapsed from time T0 when the chip select signal CS is activated, outputs a command signal CMD at time T2 when a predetermined time has elapsed from T1, and outputs an address signal ADDR at time T3 when a predetermined time has elapsed from T2.

In FIG. 9, the memory chip 110 always turns on and leaves on the CS buffer 111, turns on the CID buffer 112 at time T1, turns on the CMD buffer 113 at T2, and turns on the ADDR buffer 114 at T3, and power consumption is therefore reduced.

FIGS. 10 to 13 correspond to the case where the clock enable signal CKE transits to the low level and the memory chip performs a self-refresh operation.

Figure 10:
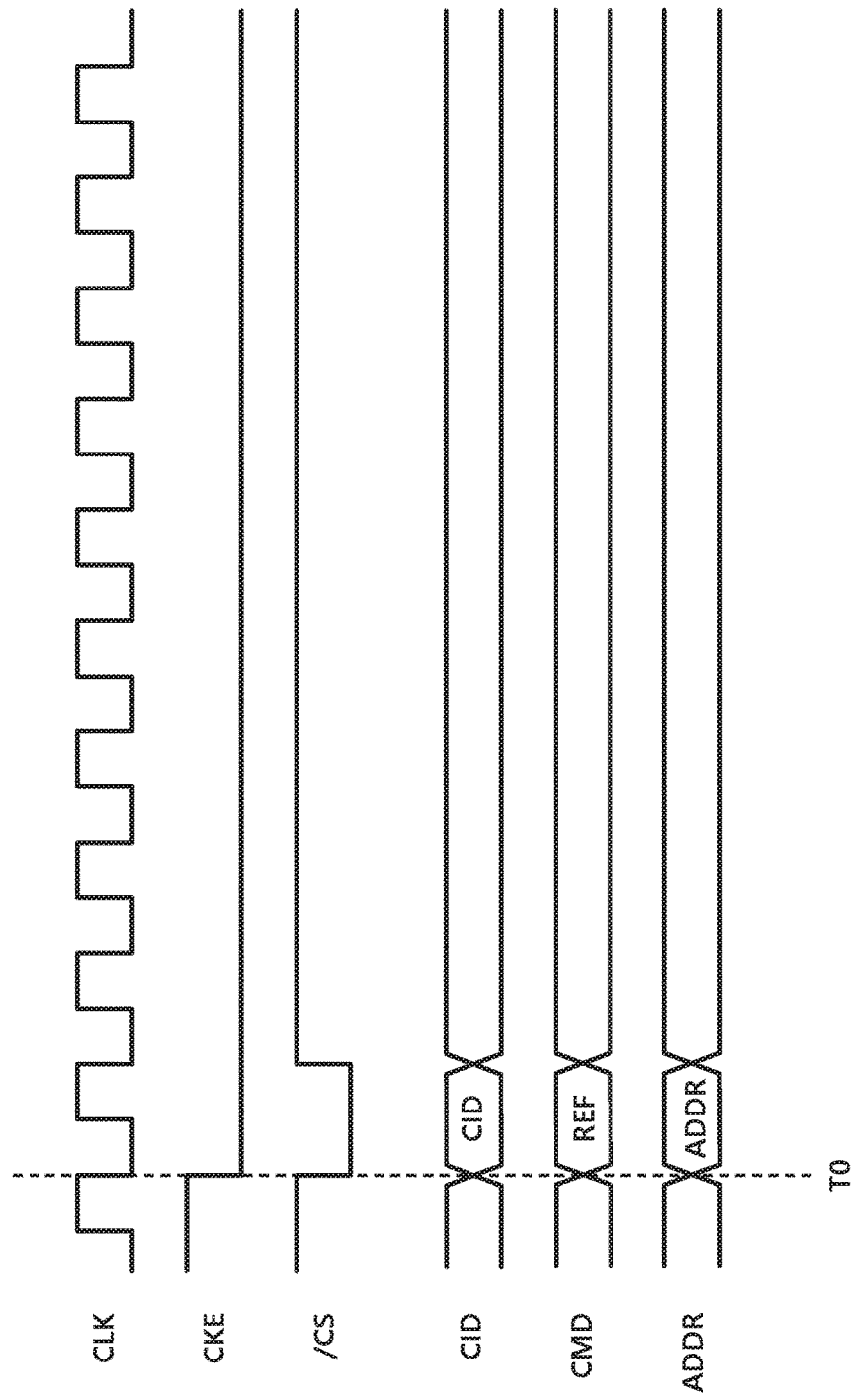

In FIG. 10, the buffer chip module 1000 starts to output the chip identification signal CID, the command signal CMD and the address signal at time T0 when the chip select signal CS is activated.

The clock enable signal CKE transits to a low level at time T0 and outputs a refresh command REF as a command signal CMD.

The memory chip 110 always turns on and leaves on the CS buffer 111, the CID buffer 112, the CMD buffer 113, and the ADDR buffer 114 in FIG. 10.

Figure 11:
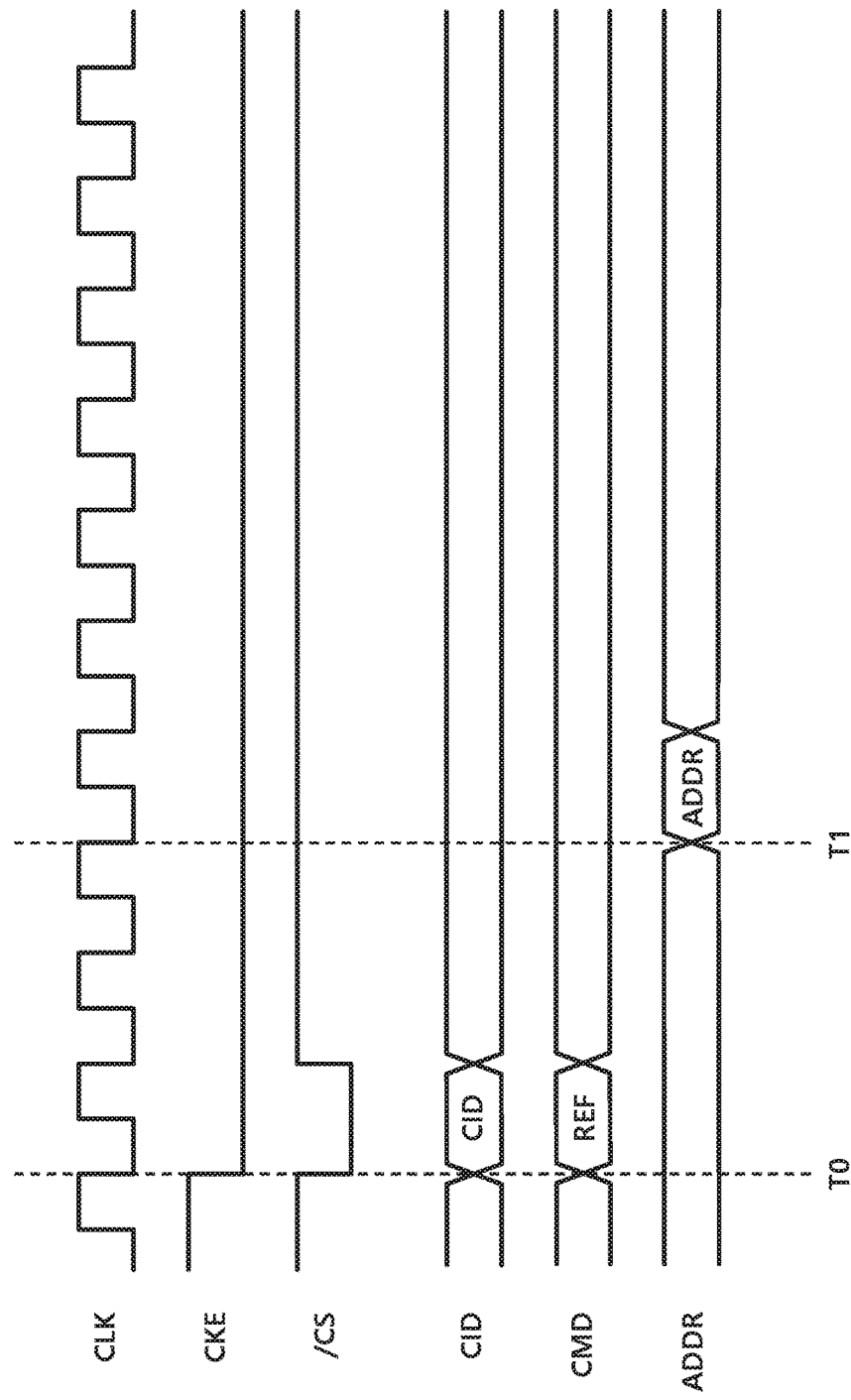

FIG. 11 shows that the buffer chip module 1000 outputs a chip identification signal CID and a command signal CMD at time T0 when the chip select signal CS is activated, and outputs an address signal ADDR at time T1 when a predetermined time has elapsed from time T0.

The clock enable signal CKE transits to a low level at time T0, and thereafter a refresh command REF is output as a command signal CMD.

In FIG. 11, the memory chip 110 always turns on and leaves on the CS buffer 111, the CID buffer 112, and the CMD buffer 113, and the memory chip 110 turns on the ADDR buffer 114 at time T1 when an address signal ADDR is input, and power consumption is therefore reduced.

Figure 12:
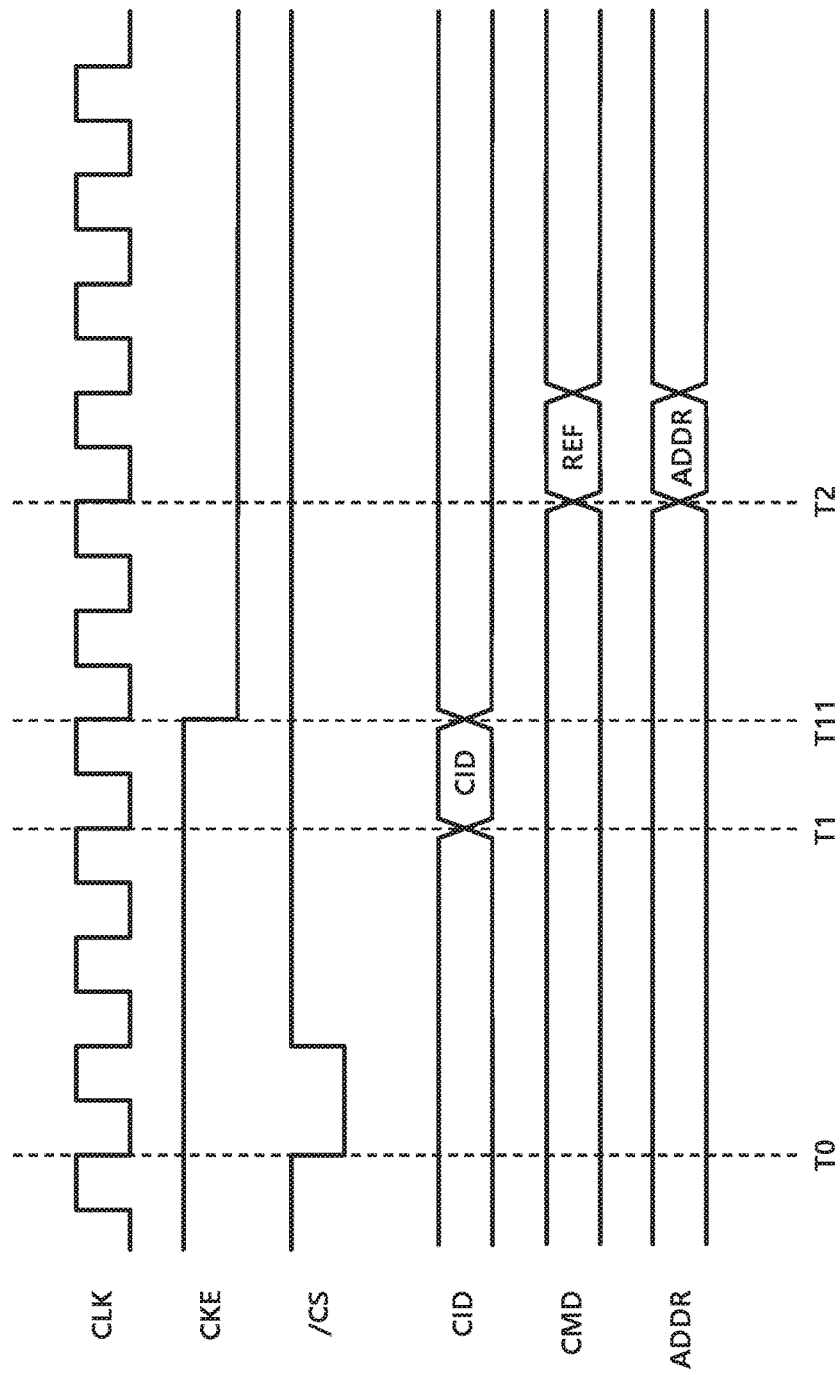

FIG. 12 shows that the buffer chip module 1000 outputs a chip identification signal CID at time T1 when a predetermined time has elapsed from time T0 when the chip select signal CS is activated, and outputs the command signal CMD and the address signal ADDR at time T2.

The clock enable signal CKE transits to a low level at time T11 between time T1 and time T2, and the refresh command REF is output as a command signal CMD thereafter.

In FIG. 12, the memory chip 110 always turns on and leaves on the CS buffer 111, turns on the CID buffer 112 at time T1, and turns on the CMD buffer 113 and the ADDR buffer 114 at time T2, and power consumption is therefore reduced.

FIG. 13 shows that the buffer chip module 1000 outputs a chip identification signal CID at time T1 when a time has elapsed from time T0 when the chip select signal CS is activated, outputs a command signal CMD at time T2 when a time has elapsed from time T1, and outputs an address signal ADDR at time T3 when time has elapsed from time T2.

The clock enable signal CKE transitions to a low level at time T11 between time T1 and time T2 and a refresh command REF is output as a command signal CMD thereafter.

In FIG. 13, the memory chip 110 always turns on and leaves on the CS buffer 111, turns on the CID buffer 112 at time T1, turns on the CMD buffer 113 at time T2, and turns on the ADDR buffer 114 at time T3, and power consumption is therefore reduced.

FIGS. 14 to 17 correspond to the case where the clock enable signal CKE transits to the high level and thereafter the memory chip finishes the self-refresh operation.

FIG. 14 shows that the buffer chip module 1000 outputs a chip identification signal CID, a command signal CMD, and an address signal ADDR at T0 when a chip select signal CS is activated.

The clock enable signal CKE transitions at time T0 to a high level and outputs a non-operation signal NOP as a command signal CMD thereafter. In the present embodiment, the non-operation signal NOP indicates stopping of a refresh operation.

In FIG. 14, the memory chip 110 always turns on and leaves on the CS buffer 111, the CID buffer 112, the CMD buffer 113, and the ADDR buffer 114.

FIG. 15 shows that a chip identification signal CID and a command signal CMD are output at time T0 when a chip select signal CS is activated and outputs an address signal ADDR at time T1 after a time has elapsed from time T0.

The clock enable signal CKE transitions to a high level at time T0 and outputs a non-operation signal NOP as a command signal CMD.

In FIG. 15, the memory chip 110 always turns on and leaves on the CS buffer 111, the CID buffer 112, and the CMD buffer 113, and turns on the ADDR buffer 114 at time T1 when the address signal ADDR is input, and power consumption is therefore reduced.

FIG. 16 is shows that the buffer chip module 1000 outputs a chip identification signal CID at time T1 when a time has elapsed from time T0 when the chip select signal CS is activated, and outputs the command signal CMD and the address signal ADDR at time T2 when a time has elapsed from T1.

The clock enable signal CKE transits to a high level at time T11 between time T1 and time T2 a non-operation signal NOP as a command signal CMD is output thereafter.

In FIG. 16, the memory chip 110 always turns on and leaves on the CS buffer 111, turns on the CID buffer 112 at time T1, and turns on the CMD buffer 113 and the ADDR buffer 114 at time T2, and power consumption is therefore reduced.

FIG. 17 shows that the buffer chip module 1000 outputs a chip identification signal CID at a time T1 when a time has elapsed from T0 when the chip select signal CS is activated, outputs a command signal CMD at T2 when a time has elapsed from T1, and outputs an address signal ADDR at T3 when a time has elapsed from T2.

The clock enable signal CKE transits to a high level at time T11 between time T1 and time T2 and a non-operation signal NOP as a command signal CMD is output thereafter.

In FIG. 17, the memory chip 110 always turns on and leaves on the CS buffer 111 at time T0, turns on the CID buffer 112 at time T1, turns on the CMD buffer 113 at T2, and turns on the ADDR buffer 114 at T3, and power consumption is therefore reduced.

As disclosed above, a memory chip and a memory module according to an embodiment of the present disclosure can reduce power consumption by controlling the activation timing of the buffer.

Although various embodiments have been described for illustrative purposes, it will be apparent to those skilled in the art that various changes and modifications may be made without departing from the spirit and scope of the disclosure as defined in the following claims.

What is claimed is:

1. A memory chip, comprising:
   a chip select (CS) buffer configured to receive a chip select signal;
   a chip identification (CID) buffer configured to receive a chip identification signal; and
   a command (CMD) buffer configured to receive a command signal,
   wherein the chip identification signal is input after a time has elapsed since the chip select signal is activated and before the command signal is input and the CID buffer is activated when the chip identification signal is input, and
   wherein the command signal is input after a time has elapsed since the identification signal is input and the CMD buffer is activated when the command signal is input.

2. The memory chip of claim 1, further comprising an address (ADDR) buffer configured to receive an address signal wherein the address signal is input after a time has elapsed since the command signal is input and the ADDR buffer is activated when the address signal is input.

3. The memory chip of claim 1, wherein the CMD buffer and the ADDR buffer maintains an off state when the chip select signal and the chip identification signal do not correspond to the memory chip.

4. The memory chip of claim 1, further comprising:
   a buffer activation controller configured to control activation of the CID buffer, the CMD buffer, and an address (ADDR) buffer.

5. The memory chip of claim 4, further comprising:
   a configuration register configured to store timing information about the activation of the CMD buffer and the ADDR buffer,
   wherein the buffer activation controller controls activation of the CID buffer, the CMD, buffer and the ADDR buffer based on the timing information about the activation of the CMD buffer and the ADDR buffer.

6. A buffer chip module, comprising:
   a control signal queue configured to receive a control signal divided into a chip select signal, a chip identification signal, a command signal, and an address signal, and to store the chip select signal, the command signal, and the address signal; and
   an arbiter configured to output the divided control signal stored in the control signal queue according to a predetermined timing condition,
   wherein the arbiter outputs the chip identification signal before outputting the command signal and after the chip select signal is activated.

7. The buffer chip module of claim 6, wherein the arbiter outputs the address signal after a time has elapsed since the command signal is output.

8. The buffer chip module of claim 6, further comprising:
   a host interface configured to transmit or receive a signal to and from a memory controller or a host;
   a control signal input circuit configured to divide and store the control signal in the control signal queue;
   a memory interface configured to transmit or receive a signal between the arbiter and a memory chip or a memory module including the memory chip; and
   a data buffer configured to buffer data between the host interface and the memory interface.

9. A memory module, comprising:
   a plurality of memory chips each including a chip select (CS) buffer buffering a chip select signal, a chip identification (CID) buffer buffering a chip identification signal, a command (CMD) buffer buffering a command signal and an address (ADDR) buffer buffering an address signal; and
   a buffer chip module configured to output the chip select signal, the chip identification signal, the command signal, and the address signal to the plurality of memory chips,
   wherein the buffer chip module outputs the chip identification signal before outputting the command signal and after a predetermined time has elapsed since the chip select signal is activated, and a CMD buffer and an ADDR buffer, included in a memory chip among the plurality of memory chips, are de-activated before the chip select signal is activated and before the chip identification signal is output.

10. The memory module of claim 9, wherein a CMD buffer and an ADDR buffer included in a memory chip among the plurality of memory chips that does not correspond to the chip select signal and the chip identification signal are de-activated.

11. The memory module of claim 10, wherein the buffer chip module outputs the command signal after a predetermined time has elapsed since the chip identification signal is output, and the memory chip among the plurality of memory chips that corresponds to the chip select signal and the chip identification signal activates a CMD buffer therein when the command signal is input.

12. The memory module of claim 11, wherein the buffer chip module outputs the address signal after a predetermined time has elapsed since the command signal is output, and the memory chip among the plurality of memory chips that corresponds to the chip select signal and the chip identification signal activates an ADDR buffer in the memory chip when the address signal is input.

13. The memory module of claim 11, wherein each of the plurality of memory chips further comprises a buffer activation controller configured to control activation of a CS buffer, a CID buffer, a CMD buffer and an ADDR buffer of the memory chip.

14. The memory module of claim 11, wherein each of the plurality of memory chips further comprises a configuration register configured to store in the configuration register timing information about activation of a CS buffer, a CID buffer, a CMD buffer and an ADDR buffer and the buffer activation controller controls activation referring to the configuration register.

15. The memory module of claim 9, wherein the buffer chip module comprises:
   a control signal queue configured to divide the control signal into the chip select signal, the chip identification signal, the command signal, the address signal and to store the chip select signal, the chip identification signal, the command signal and the address signal; and an arbiter configured to output the divided control signal stored in the control signal queue according to a predetermined timing condition.

16. The memory module of claim 15, wherein the buffer chip module comprises:

a host interface configured to transmit or receive a signal to and from a memory controller or a host;

a control signal input circuit configured to divide and store the control signal in the control signal queue;

a memory interface configured to transmit or receive a signal between the arbiter and a memory chip or a memory module including the memory chip; and a data buffer configured to buffer data between the host interface and the memory interface.

17. The memory module of claim 9, wherein the plurality of memory chips are included in a single semiconductor chip.

* * * * *